(12) United States Patent
HuangFu

(10) Patent No.: US 10,804,137 B2
(45) Date of Patent: Oct. 13, 2020

(54) SOI SUBSTRATE MANUFACTURING METHOD AND SOI SUBSTRATE

(71) Applicant: HUAWEI TECHNOLOGIES CO.,LTD., Shenzhen, Guangdong (CN)

(72) Inventor: Yourui HuangFu, Hangzhou (CN)

(73) Assignee: Huawei Technologies Co., Ltd., Shenzhen (CN)

(*) Notice: Subject to any disclaimer, the term of this patent is extended or adjusted under 35 U.S.C. 154(b) by 169 days.

(21) Appl. No.: 15/214,257

(22) Filed: Jul. 19, 2016

(65) Prior Publication Data

US 2016/0329239 A1    Nov. 10, 2016

Related U.S. Application Data

(63) Continuation of application No. PCT/CN2014/071108, filed on Jan. 22, 2014.

(51) Int. Cl.
| | | |
|---|---|---|
| *H01L 21/762* | (2006.01) | |
| *H01L 21/311* | (2006.01) | |
| *H01L 33/00* | (2010.01) | |
| *H01L 21/02* | (2006.01) | |
| *H01L 31/18* | (2006.01) | |

(52) U.S. Cl.
CPC .... *H01L 21/76254* (2013.01); *H01L 21/0254* (2013.01); *H01L 21/02543* (2013.01); *H01L 21/02546* (2013.01); *H01L 21/02549* (2013.01); *H01L 21/31144* (2013.01);
(Continued)

(58) Field of Classification Search
CPC ......... H01L 21/02038; H01L 21/76256; H01L 21/76264; H01L 23/147; H01L 27/1207; H01L 21/76254; H01L 21/02107; H01L 21/022; H01L 21/7624–76297; H01L 21/76248; H01L 21/76251; H01L 21/76272; H01L 21/76275; H01L 21/76283; H01L 21/76294; H01L 21/02636–02653; H01L 21/02639–0265;
(Continued)

(56) References Cited

U.S. PATENT DOCUMENTS

| | | | |
|---|---|---|---|
| 5,935,762 A * | 8/1999 | Dai ........................ | G03F 7/265 |
| | | | 257/E21.579 |
| 6,191,007 B1 | 2/2001 | Matsui et al. | |

(Continued)

FOREIGN PATENT DOCUMENTS

| | | |
|---|---|---|
| CN | 1564308 A | 1/2005 |
| CN | 1983656 A | 6/2007 |

(Continued)

OTHER PUBLICATIONS

Yourui Huangfu et al. Monolithic integration of III-V devices with Silicon Photonics on a modified SOI platform. 2015 IEEE. total 2 pages.

*Primary Examiner* — Eric A. Ward
*Assistant Examiner* — Eric K Ashbahian
(74) *Attorney, Agent, or Firm* — Fish & Richardson P.C.

(57) ABSTRACT

An SOI substrate manufacturing method and an SOI substrate are provided, where the method includes: forming a patterned etch-stop layer in an oxide layer of a first silicon substrate, bonding a surface, having the patterned etch-stop layer (130), of the first silicon substrate with a surface of a second silicon substrate, and peeling off a part of the first silicon substrate to form a patterned SOI substrate.

18 Claims, 9 Drawing Sheets

(52) U.S. Cl.
CPC .... *H01L 21/76248* (2013.01); *H01L 31/1856* (2013.01); *H01L 33/0093* (2020.05)

(58) Field of Classification Search
CPC .... H01S 5/02296; H01S 5/3013; H01S 5/026; H01S 5/323; G02B 6/122
See application file for complete search history.

(56) References Cited

U.S. PATENT DOCUMENTS

| | | | |
|---|---|---|---|
| 6,191,008 | B1 | 2/2001 | So |
| 6,245,645 | B1 | 6/2001 | Mitani et al. |
| 9,837,566 | B2* | 12/2017 | Ji .................... H01L 31/03845 |
| 2001/0016401 | A1 | 8/2001 | Mitani et al. |
| 2002/0022308 | A1* | 2/2002 | Ahn ................. H01L 21/02238 438/164 |
| 2003/0048395 | A1 | 3/2003 | Yasui |
| 2006/0160291 | A1 | 7/2006 | Lee et al. |
| 2008/0006849 | A1 | 1/2008 | Liu et al. |
| 2008/0079123 | A1 | 4/2008 | Kostrzewa et al. |
| 2008/0258271 | A1* | 10/2008 | Lee .................. H01L 21/31641 257/637 |
| 2009/0035934 | A1* | 2/2009 | Sreenivasan ......... H01L 27/101 438/622 |
| 2009/0096022 | A1 | 4/2009 | Chang et al. |
| 2009/0206441 | A1 | 8/2009 | Zhu |
| 2010/0176453 | A1 | 7/2010 | Dennard et al. |
| 2010/0295104 | A1* | 11/2010 | Kaper ................. H01L 21/8258 257/288 |
| 2011/0049568 | A1* | 3/2011 | Lochtefeld ........ H01L 21/02381 257/190 |
| 2011/0097873 | A1* | 4/2011 | Lee .................... H01L 21/76254 438/458 |
| 2012/0028444 | A1* | 2/2012 | Vellianitis ......... H01L 21/02381 438/478 |
| 2012/0168823 | A1* | 7/2012 | Luo .................. H01L 21/76224 257/200 |
| 2012/0270378 | A1* | 10/2012 | Kittler .............. H01L 21/02381 438/400 |

FOREIGN PATENT DOCUMENTS

| | | |
|---|---|---|
| CN | 101369525 A | 2/2009 |
| CN | 102332423 A | 1/2012 |
| JP | H04084418 A | 3/1992 |
| JP | H11111839 A | 4/1999 |
| JP | 2000030996 A | 1/2000 |
| JP | 2003152193 A | 5/2003 |
| RU | 2368034 C1 | 9/2009 |
| RU | 2497231 C1 | 10/2013 |

* cited by examiner

300

SOI SUBSTRATE MANUFACTURING METHOD AND SOI SUBSTRATE

CROSS-REFERENCE TO RELATED APPLICATIONS

This application is a continuation of International Application No. PCT/CN2014/071108, filed on Jan. 22, 2014.

TECHNICAL FIELD

Embodiments of the present disclosure relate to semiconductor device technologies, and in particular, to an SOI substrate manufacturing method and an SOI substrate.

BACKGROUND

With miniaturization and diversification of a semiconductor integrated circuit, a feature size of a device is reducing and device integration is improving, while problems such as a signal delay and interconnect crosstalk are caused. Due to high power consumption and a waste of energy caused by common usage of an electrical interconnect dielectric, a requirement of a semiconductor industry for high performance and low costs on a device already cannot be met. However, optical interconnection can effectively resolve the foregoing problems and bring about many new functions to a conventional integrated circuit, and therefore, a photoelectric device becomes a main direction for high integration development of a semiconductor device.

Currently, a commonly-used silicon on insulator (SOI) substrate is obtained by introducing a buried oxide layer between a top-layer silicon substrate and a bottom-layer silicon substrate. Specifically, a semiconductor thin film is formed on an insulator, so that the SOI substrate has advantages unmatched by a bulk silicon substrate. For example, the SOI substrate can implement dielectric isolation between components in an integrated circuit, eliminating a parasitic latch-up effect in a bulk silicon Complementary Metal-Oxide-Semiconductor (CMOS) circuit; an integrated circuit manufactured using the SOI substrate further has advantages, such as small parasitic capacitance, high integration density, high speed, simple technique, small short-channel effect, and being particularly applicable to a low-voltage and low-power consumption circuit. Therefore, the SOI substrate is likely to become a mainstream technology for a deep-submicron, low-voltage, and low-power consumption integrated circuit. However, in a process of manufacturing a photoelectric device or an optical waveguide device using the SOI substrate, a heterojunction needs to be epitaxially grown. For example, a III-V compound is epitaxially grown on a silicon layer of the SOI substrate, and a substrate material having good photoelectric performance may be obtained, and is a suitable to serve as a substrate material of the photoelectric device.

In the prior art, when a heteroepitaxial layer is grown on the silicon layer of the SOI substrate, because lattice mismatch and thermal mismatch occur between the silicon layer and the heteroepitaxial layer, a problem of high-density threading dislocations is caused in the substrate, reducing usage performance and reliability of the photoelectric device.

SUMMARY

Embodiments of the present disclosure provide an SOI substrate manufacturing method and an SOI substrate, to resolve a problem in the prior art that when a heteroepitaxial layer is grown on a silicon layer of an SOI substrate, lattice mismatch and thermal mismatch occur between the silicon layer and the heteroepitaxial layer, resulting in high-density threading dislocations.

According to a first aspect, an embodiment of the present disclosure provides an SOI substrate manufacturing method, including:

forming a patterned etch-stop layer in an oxide layer of a first silicon substrate; and bonding a surface, having the patterned etch-stop layer, of the first silicon substrate with a silicon surface of a second silicon substrate, and peeling off a part of the first silicon substrate to form a patterned SOI substrate.

In a first possible implementation manner of the first aspect, the forming a patterned etch-stop layer in an oxide layer of a first silicon substrate includes:

forming a first oxide layer on the first silicon substrate; and forming the patterned etch-stop layer on the first oxide layer of the first silicon substrate.

According to the first possible implementation manner of the first aspect, in a second possible implementation manner, the forming the patterned etch-stop layer on the first oxide layer of the first silicon substrate includes:

forming an etch-stop layer on the first oxide layer of the first silicon substrate; and forming a patterned mask on the etch-stop layer, and obtaining the patterned etch-stop layer through etching, where the patterned mask includes a patterned photoresist obtained using an extreme ultraviolet (EUV) lithography method.

According to the first possible implementation manner of the first aspect, in a third possible implementation manner, the forming the patterned etch-stop layer on the first oxide layer of the first silicon substrate includes:

forming an etch-stop layer on the first oxide layer of the first silicon substrate; and forming a patterned mask on the etch-stop layer, and obtaining the patterned etch-stop layer through etching, where the patterned mask includes a porous alumina film.

According to any one of the first to the third possible implementation manners of the first aspect, in a fourth possible implementation manner, after the forming the patterned etch-stop layer on the first oxide layer of the first silicon substrate, the method further includes:

growing a second oxide layer on the patterned etch-stop layer, and performing flattening processing and chemical surface processing on the second oxide layer.

According to any one of the first to the fourth possible implementation manners of the first aspect, in a fifth possible implementation manner, before the forming the patterned etch-stop layer on the first oxide layer of the first silicon substrate, the method further includes:

performing ion implantation on the first silicon substrate, and forming a defect layer in a silicon layer of the first silicon substrate, where the peeling off a part of the first silicon substrate includes peeling off the defect layer in the first silicon substrate and a silicon layer on the defect layer; and after the bonding a surface, having the patterned etch-stop layer, of the first silicon substrate with a surface of a second silicon substrate, and peeling off a part of the first silicon substrate to form a patterned SOI substrate, the method further includes:

performing low-temperature annealing processing, so that abutted surfaces of the first silicon substrate and the second silicon substrate are tightly bonded; and performing surface polishing processing on the patterned SOI substrate.

According to any one of the first aspect and the first to the fifth possible implementation manners of the first aspect, in a sixth possible implementation manner, a material of the patterned etch-stop layer is a material having etching selectivity to the oxide layer.

According to any one of the first aspect and the first to the sixth possible implementation manners of the first aspect, in a seventh possible implementation manner, a pattern size of the patterned etch-stop layer is less than 20 nm, and a thickness of the patterned etch-stop layer is less than 50 nm.

According to any one of the first aspect and the first to the seventh possible implementation manners of the first aspect, in an eighth possible implementation manner, the method further includes:

forming a patterned mask on the patterned SOI substrate to expose a device forming area;

etching the device forming area on the patterned SOI substrate to obtain a patterned oxide layer on the second silicon substrate; and epitaxially growing a III-V compound in the device forming area to form a device structure.

According to the eighth possible implementation manner of the first aspect, in a ninth possible implementation manner, the etching the device forming area on the patterned SOI substrate to obtain a patterned oxide layer on the second silicon substrate includes:

etching the silicon layer, the first oxide layer, and a part of the second oxide layer of the first silicon substrate in the device forming area on the patterned SOI substrate to obtain the patterned oxide layer on the second silicon substrate and the patterned etch-stop layer, where the patterned oxide layer is under the patterned etch-stop layer; and removing the patterned etch-stop layer in the device forming area on the patterned SOI substrate to obtain the patterned oxide layer on the second silicon substrate.

According to the eighth or the ninth possible implementation manner of the first aspect, in a tenth possible implementation manner, the epitaxially growing a III-V compound in the device forming area to form a device structure includes:

growing a third oxide layer on the second silicon substrate on which the patterned oxide layer has already been obtained, where the third oxide layer is grown outside the device forming area; and epitaxially growing the III-V compound on the patterned oxide layer of the second silicon substrate on which the third oxide layer is already grown, to form the device structure, where the epitaxially grown III-V compound is connected to the second silicon substrate in a pattern of the patterned oxide layer of the second silicon substrate.

According to any one of the eighth to the tenth possible implementation manners of the first aspect, in an eleventh possible implementation manner, the III-V compound includes aluminium phosphide (AlP), gallium phosphide (GaP), indium phosphide (InP), aluminium arsenide (AlAs), gallium arsenide (GaAs), indium arsenide (InAs), aluminium antimonide (AlSb), gallium antimonide (GaSb), indium antimonide (InSb), aluminium nitride (AlN), gallium nitride (GaN), indium nitride (InN), or ternary and quaternary compounds thereof.

According to any one of the eighth to the eleventh possible implementation manners of the first aspect, in a twelfth possible implementation manner, the epitaxially growing a III-V compound in the device forming area to form a device structure includes:

growing the III-V compound in the device forming area by means of a molecular beam epitaxy (MBE) technique, a chemical vapor deposition (CVD) technique, an atomic layer deposition (ALD) technique, or a variation technique thereof, to form the device structure.

According to any one of the eighth to the twelfth possible implementation manners of the first aspect, in a thirteenth possible implementation manner, the method further includes:

performing annealing processing on the patterned SOI substrate in which the device structure is already formed, to reduce a defect caused by epitaxial lateral overgrowth (ELO) of the III-V compound in the device forming area.

According to any one of the eighth to the thirteenth possible implementation manners of the first aspect, in a fourteenth possible implementation manner, the method further includes:

forming a photoelectric device structure in the device structure, where the photoelectric device structure includes a multi-layer structure.

According to a second aspect, an embodiment of the present disclosure provides an SOI substrate, where the SOI substrate is manufactured using the SOI substrate manufacturing method provided in the foregoing embodiment of the present disclosure.

According to the SOI substrate manufacturing method and the SOI substrate provided in the embodiments, a patterned etch-stop layer is formed in an oxide layer of a first silicon substrate, a surface, having the patterned etch-stop layer, of the first silicon substrate is bonded with a silicon surface of a second silicon substrate, and a part of the first silicon substrate is peeled off to form a patterned SOI substrate after processing, which resolves a problem in the prior art that when a heteroepitaxial layer is grown on a silicon layer of an SOI substrate, lattice mismatch and thermal mismatch occur between the silicon layer and the heteroepitaxial layer, resulting in high-density threading dislocations. In the patterned SOI substrate provided in the embodiments, a heteroepitaxial layer without threading dislocations can be formed on a silicon substrate, so that usage performance and reliability of a photoelectric device are improved.

BRIEF DESCRIPTION OF DRAWINGS

The following briefly describes the accompanying drawings required for describing the embodiments or the prior art.

DESCRIPTION OF EMBODIMENTS

The following describes the technical solutions in the embodiments of the present disclosure with reference to the accompanying drawings in the embodiments of the present disclosure.

Embodiment 1

Figure 1:
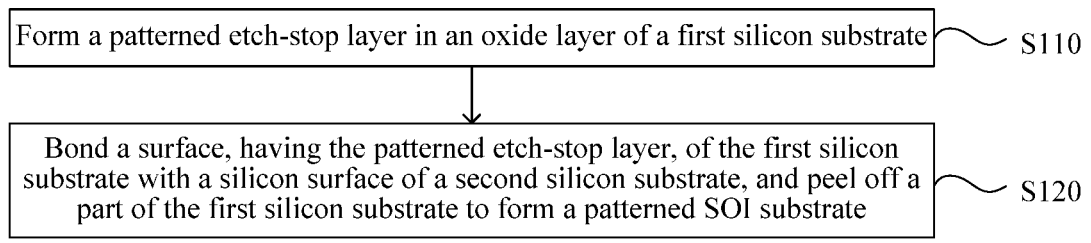
FIG. 1 is a flowchart of an SOI substrate manufacturing method according to Embodiment 1 of the present disclosure.

FIG. 1 is a flowchart of an SOI substrate manufacturing method according to Embodiment 1 of the present disclosure. The method in this embodiment is applicable to a scenario of manufacturing a semiconductor device structure. The method in this embodiment includes the following steps:

S110: Form a patterned etch-stop layer in an oxide layer of a first silicon substrate.

Figure 2:
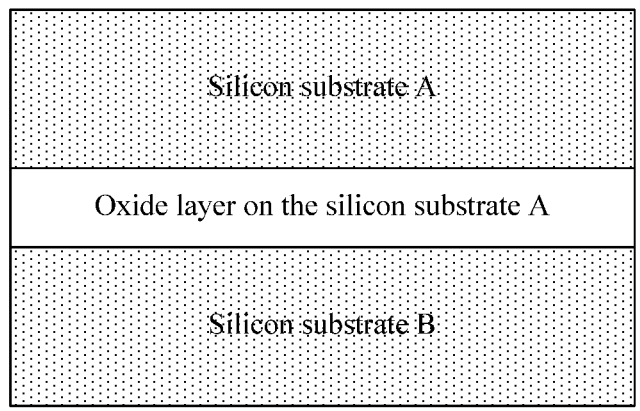
FIG. 2 is a schematic structural diagram of an SOI substrate according to the prior art.
Figure 3A:
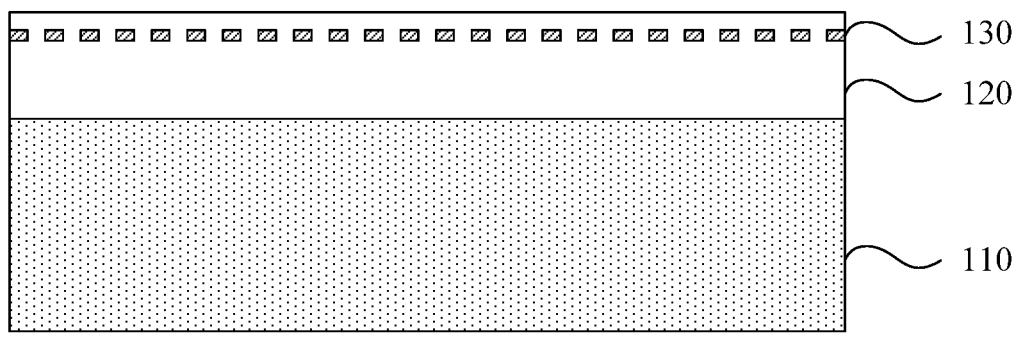
FIG. 3A and FIG. 3B are schematic diagrams of a substrate structure in the SOI substrate manufacturing method according to the embodiment shown in FIG. 1.

Currently, in a structure of a commonly used SOI substrate, an oxide layer is introduced between a top-layer silicon substrate and a bottom-layer silicon substrate. As shown in FIG. 2, FIG. 2 is a schematic structural diagram of an SOI substrate according to the prior art. Manufacture of the SOI substrate in the prior art generally needs two wafer substrates, which are specifically a silicon substrate A and a silicon substrate B. An oxide layer is formed on the silicon substrate A, and the silicon substrate A having the oxide layer is turned over to bond with a silicon surface of the silicon substrate B. Specifically, the oxide layer of the silicon substrate A is bonded with a silicon layer on the surface of the silicon substrate B to form a substrate structure in which there is an oxide layer between a top-layer silicon substrate and a bottom-layer silicon substrate. Although the existing SOI substrate has better performance than a general silicon substrate, when a heterojunction is epitaxially grown on a silicon layer of the existing SOI substrate, dislocations are still caused in an epitaxial layer. Unlike the prior art, in this embodiment, there is a patterned film in the oxide layer between the two silicon substrates. As shown in FIG. 3A, FIG. 3A is a schematic diagram of a substrate structure in the SOI substrate manufacturing method according to the embodiment shown in FIG. 1. In a specific manufacturing process, a patterned etch-stop layer 130 may be formed in an oxide layer 120 of a first silicon substrate 110, where the patterned etch-stop layer 130 is formed in the middle and upper of the oxide layer 120.

It should be noted that, in this embodiment, a pattern size of the patterned etch-stop layer 130 may be less than 20 nm, and a thickness of the patterned etch-stop layer 130 may be less than 50 nm. Similarly, a thickness of an oxide layer above the patterned etch-stop layer 130 may also be less than 50 nm, and oxide layers above and under the patterned etch-stop layer 130 are connected as a whole.

According to a theory proposed by Luryi and Suhir, a stress field σ vertical to an epitaxial layer on a substrate accords with exponential decay in a growing direction z, as indicated by the following expression (1):

$$\sigma \propto e^{-\frac{\pi z}{2l}}. \tag{1}$$

In the foregoing expression (1), 2l is a lateral dimension of a pattern, and it can be known that the stress field σ exponentially decays as a pattern size is decreased. Therefore, as long as the pattern is small enough, a critical thickness of an epitaxial layer in which dislocations occur tends to infinity, which is equivalent to that a heteroepitaxial layer without threading dislocations can be formed on a silicon substrate.

According to the SOI substrate manufacturing method provided in this embodiment, the patterned etch-stop layer 130 whose pattern size is extremely small is formed in the oxide layer 120 of the first silicon substrate 110. An SOI substrate manufactured using this method is applicable to growing a material having lattice mismatch with silicon, and a heteroepitaxial layer without threading dislocations can be formed on a silicon substrate.

S120: Bond a surface, having the patterned etch-stop layer, of the first silicon substrate with a silicon surface of a second silicon substrate, and peel off a part of the first silicon substrate to form a patterned SOI substrate.

Figure 3B:
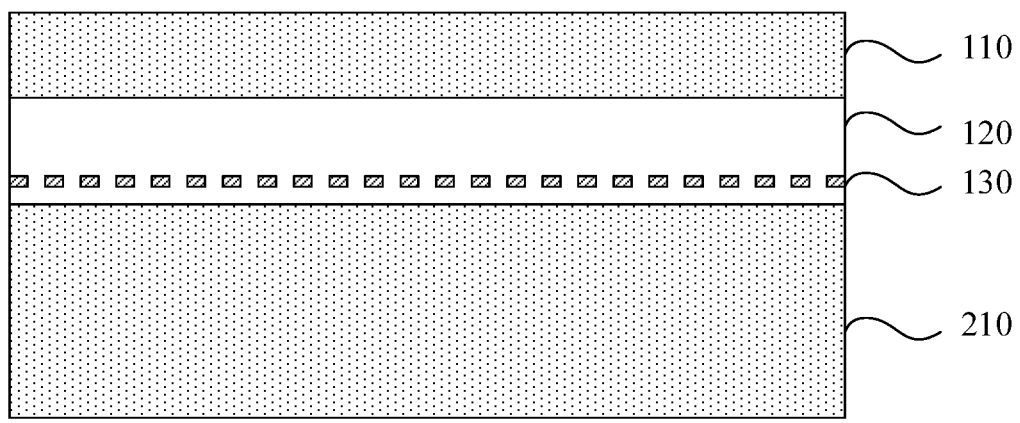

In this embodiment, the patterned etch-stop layer 130 is already formed in the oxide layer 120 of the first silicon substrate 110, there may be a thin oxide layer on a surface of a second silicon substrate 210, and the oxide layer on the surface of the second silicon substrate 210 may be a natural oxide layer, or may be formed using a thermal oxidation technique. When bonding processing is performed on the first silicon substrate 110 and the second silicon substrate 210, the first silicon substrate 110 may be turned over, so that a surface, having the patterned etch-stop layer 130, of the first silicon substrate 110 is bonded with the surface of the second silicon substrate 210, and then a part of the first silicon substrate 110 is peeled off to obtain a substrate structure in which the oxide layer 120 exists between the first silicon substrate 110 and the second silicon substrate 210, that is, a patterned SOI substrate 300. As shown in FIG. 3B, FIG. 3B is a schematic diagram of a substrate structure in the SOI substrate manufacturing method according to the embodiment shown in FIG. 1. In addition, the patterned etch-stop layer 130 is in the oxide layer 120 of the patterned SOI substrate 300 provided in this embodiment.

According to the SOI substrate manufacturing method provided in this embodiment, a patterned etch-stop layer is formed in an oxide layer of a first silicon substrate, a surface, having the patterned etch-stop layer, of the first silicon substrate is bonded with a silicon surface of a second silicon substrate, and a part of the first silicon substrate is peeled off to form a patterned SOI substrate. The structure can resolve a problem in the prior art that when a heteroepitaxial layer is grown on a silicon layer of an SOI substrate, a great quantity of threading dislocations is caused in the epitaxial layer due to lattice mismatch and thermal mismatch occurred between the silicon layer and the heteroepitaxial layer. According to the patterned SOI substrate provided in this embodiment, a heteroepitaxial layer without threading dislocations can be formed on a silicon substrate, improving usage performance and reliability of a photoelectric device.

Embodiment 2

Figure 4:
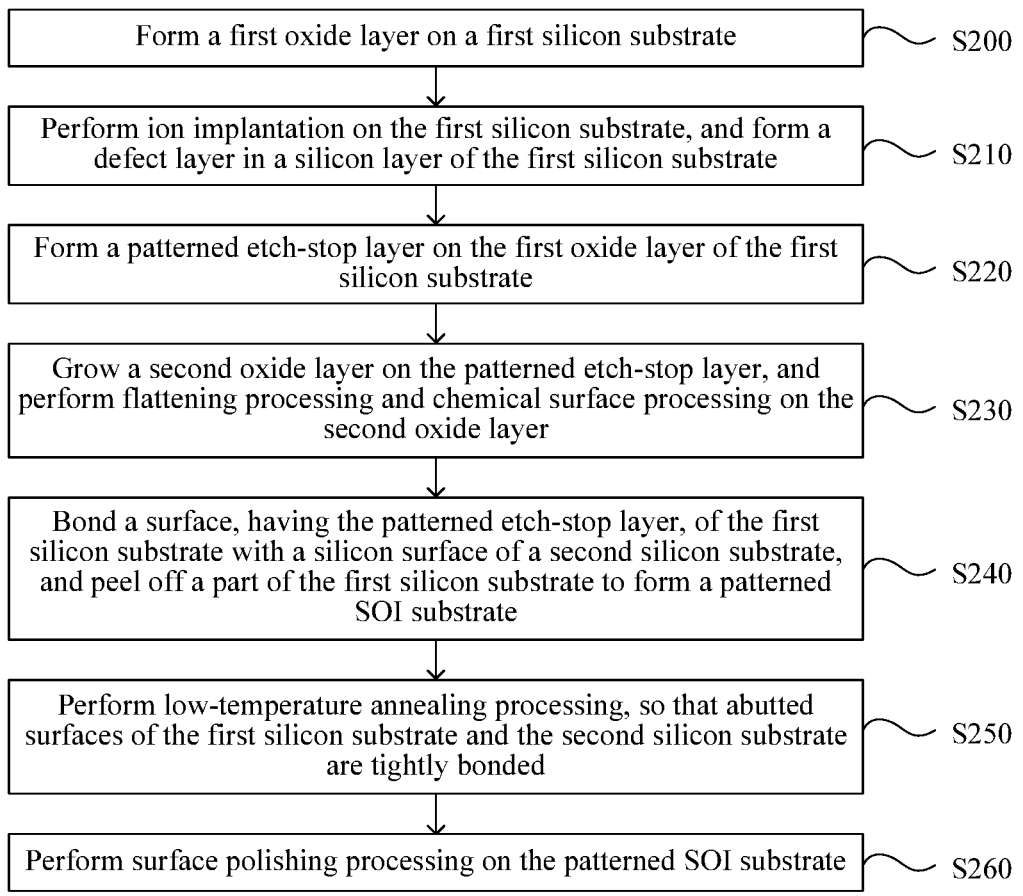
FIG. 4 is a flowchart of an SOI substrate manufacturing method according to Embodiment 2 of the present disclosure.

FIG. 4 is a flowchart of an SOI substrate manufacturing method according to Embodiment 2 of the present disclosure. FIG. 5A to FIG. 5G are schematic diagrams of a substrate structure in the SOI substrate manufacturing method according to the embodiment shown in FIG. 4. The SOI substrate manufacturing method provided in this embodiment includes:

S200: Form a first oxide layer on a first silicon substrate.

Figure 5A:
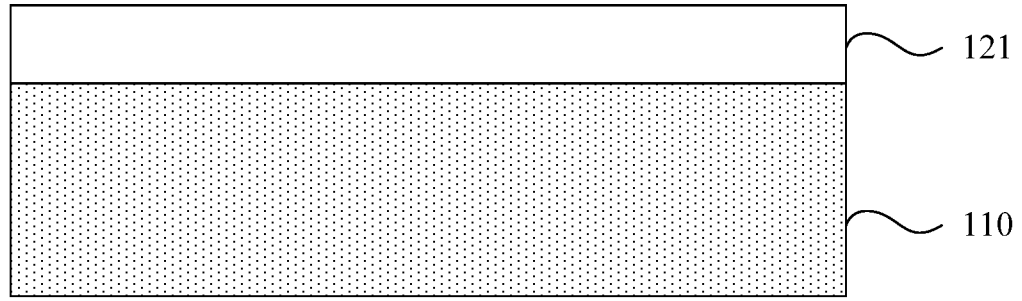
FIG. 5A to FIG. 5G are schematic diagrams of a substrate structure in the SOI substrate manufacturing method according to the embodiment shown in FIG. 4.

Referring to FIG. 5A, in this embodiment, two silicon substrates may be provided first, which are specifically a first silicon substrate 110 and a second silicon substrate 210 (which is not shown in FIG. 5A). Because in a basic structure of an SOI substrate, an oxide layer is added between the two silicon substrates, in specific implementation, a first oxide layer 121 may be formed on the first silicon substrate 110 in this embodiment, and generally thermal oxidation processing may be performed on the first silicon substrate 110 to form the first oxide layer 121 on a silicon surface.

S210: Perform ion implantation on the first silicon substrate, and form a defect layer in a silicon layer of the first silicon substrate.

Figure 5B:
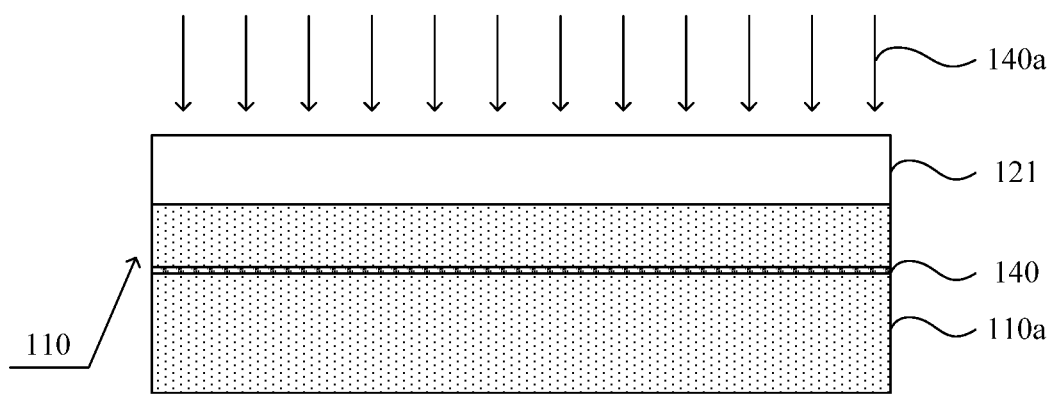

Referring to FIG. 5B, in this embodiment, ion implantation is performed on the first silicon substrate 110 on which the first oxide layer 121 is already grown, and generally high-energy ion implantation may be performed, where an ion beam 140a is guided into the first silicon substrate 110 using an amount of energy, and the ion beam can pass through the first oxide layer 121 and a part of the first silicon substrate 110, and further reacts with silicon at a depth in the first silicon substrate 110, to form a defect layer 140 at the depth, where the depth of the defect layer 140 depends on incident energy of the ion beam 140a.

S220: Form a patterned etch-stop layer on the first oxide layer of the first silicon substrate.

Specifically, for specific implementation of S220, refer to S110 in Embodiment 1.

Optionally, S220 in this embodiment may include: forming an etch-stop layer 130 on the first oxide layer 121 of the first silicon substrate 110, forming a patterned mask on the etch-stop layer 130, and obtaining a patterned etch-stop layer 130 using an etching technique. The patterned mask includes a patterned photoresist obtained using an extreme ultraviolet (EUV) lithography method, and a pattern whose feature size is less than 20 nm may be manufactured using a EUV photolithography technique.

Figure 5C:
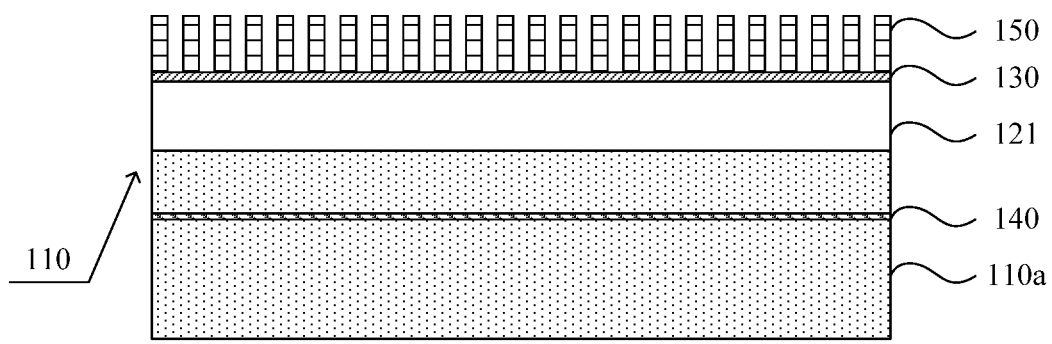
Figure 5D:
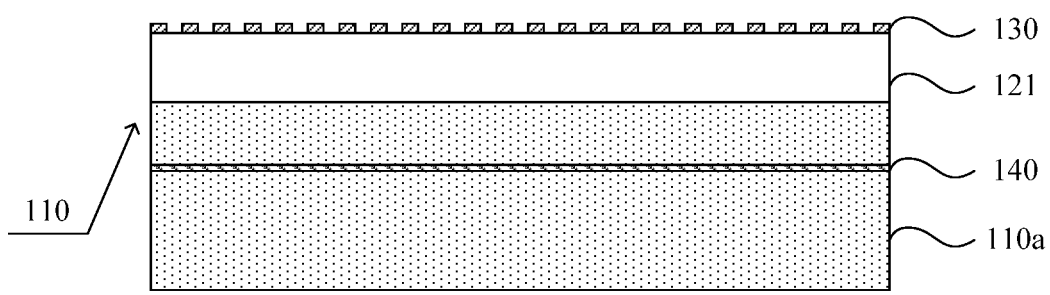

Referring to FIG. 5C, in this embodiment, the patterned etch-stop layer 130 is formed using a photolithography technology, and the patterned mask is formed on the grown etch-stop layer 130. Specifically, a photoresist pattern 150 whose pattern size is extremely small may be formed on the etch-stop layer 130 after exposure to EUV and development. Referring to FIG. 5D, the first silicon substrate 110 is etched using the photoresist pattern 150 as a mask, and a part, not covered by the photoresist pattern 150, of the etch-stop layer 130 is etched to form the patterned etch-stop layer 130.

It should be noted that, a material of the patterned etch-stop layer 130 is a material having etching selectivity to the first oxide layer 121, and may generally include a material such as silicon nitride, aluminium oxide, titanium oxide, silicon rich silicon oxide, or hydrogen rich silicon nitride, where these materials may have a high etching selective ratio to the first oxide layer 121.

In another possible implementation manner of this embodiment, the patterned mask may also be a porous alumina film; in this implementation manner, the photolithography technology is not required, and the porous alumina film is directly stuck on the etch-stop layer 130 for patterning processing. Similar to the foregoing embodiment, in this embodiment, a pattern size of the patterned mask may be less than 20 nm, and a pattern size of the patterned etch-stop layer 130 may also be less than 20 nm.

S230: Grow a second oxide layer on the patterned etch-stop layer, and perform flattening processing and chemical surface processing on the second oxide layer.

Figure 5E:
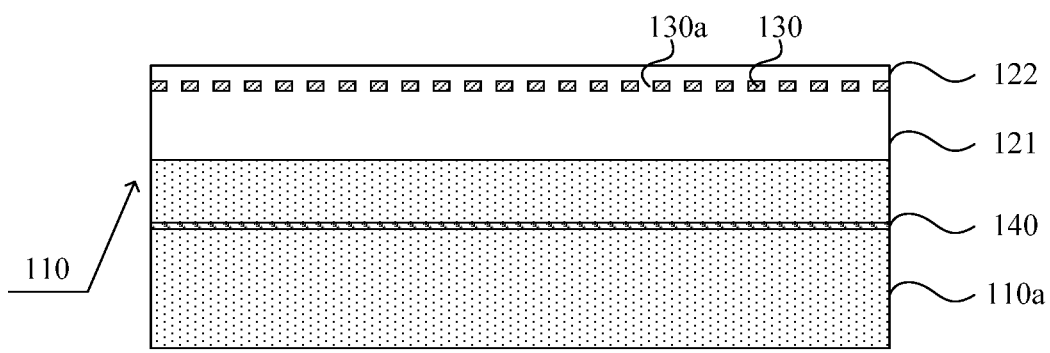

Referring to FIG. 5E, in this embodiment, the patterned etch-stop layer 130 formed on the first oxide layer 121 of the first silicon substrate 110 is a small-size pattern whose surface protrudes, and bonding processing cannot be performed directly between a surface of the patterned etch-stop layer 130 and the second silicon substrate 210. Therefore, a second oxide layer 122 may be further grown on the patterned etch-stop layer 130, and flattening processing and chemical surface processing may be performed on the further grown second oxide layer 122, so that the first silicon substrate 110 has a smooth surface.

It should be noted that, the first oxide layer 121 and the second oxide layer 122 may be made of a silicon oxide material, a thickness of the second oxide layer 122 may be less than 50 nm, film materials of the second oxide layer 122 and the first oxide layer 121 are generally the same, and the second oxide layer 122 is connected to the first oxide layer 121 in a window area 130a of the patterned etch-stop layer 130, so as to form an oxide layer having an integral structure.

S240: Bond a surface, having the patterned etch-stop layer, of the first silicon substrate with a silicon surface of a second silicon substrate, and peel off a part of the first silicon substrate to form a patterned SOI substrate.

Specifically, for specific implementation of the bonding processing in S240, reference may be made to S120 in Embodiment 1.

Figure 5F:
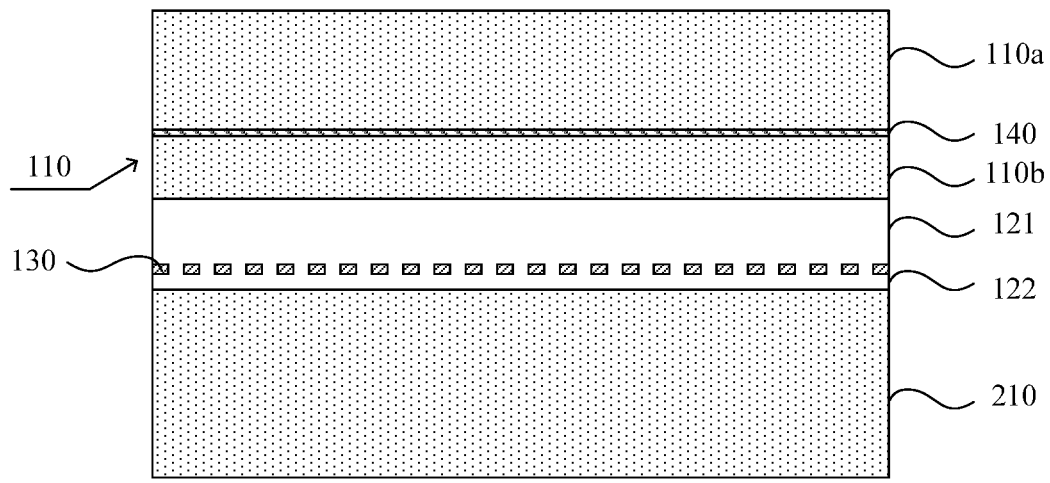

Referring to FIG. 5F, there is the defect layer 140 at a depth of the silicon layer of the first silicon substrate 110 in this embodiment, and a semiconductor structure formed in this embodiment is a substrate structure in which there is the oxide layer between the first silicon substrate 110 and the second silicon substrate 210. Specifically, there is the patterned etch-stop layer 130 between the first oxide layer 121 and the second oxide layer 122.

Figure 5G:
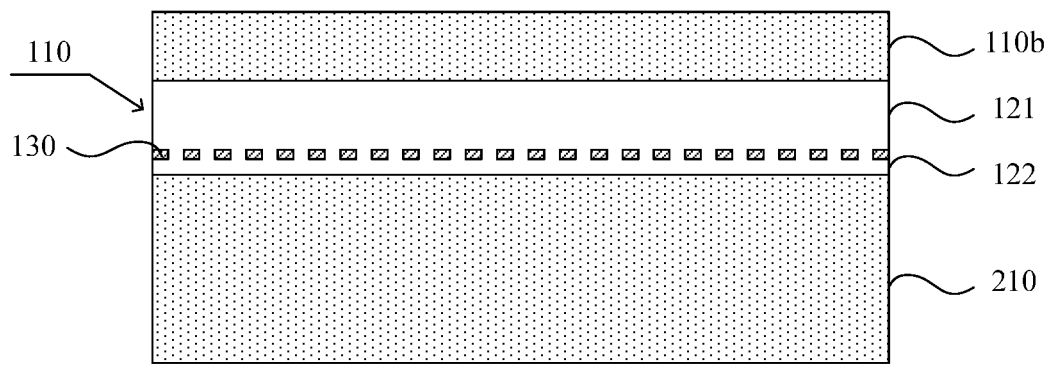

Referring to FIG. 5G, in this embodiment, the ion implantation is performed on the first silicon substrate 110 on which the first oxide layer 121 is already grown, and therefore, the defect layer 140 is formed in the silicon layer of the first silicon substrate 110. Because molecular combination between the defect layer 140 and a silicon layer 110a in the first silicon substrate 110 in which the defect layer 140 is already formed is weakened, the silicon layer 110a can be peeled off from the defect layer 140, that is, the upper silicon layer 110a may be peeled off, and the defect layer 140 is also peeled off, only leaving a part, under the defect layer 140, of the first silicon substrate 110. As shown in FIG. 5F and FIG. 5G, a silicon layer 110b of the first silicon substrate 110 is left after the peeling off, and a patterned SOI substrate 300 is obtained. Further, the silicon layer 110a that is peeled off from the first silicon substrate 110 may be used to manufacture a silicon substrate again using a polishing technique, implementing reuse of the silicon substrate, reducing production costs, and improving production benefits.

S250: Perform low-temperature annealing processing, so that abutted surfaces of the first silicon substrate and the second silicon substrate are tightly bonded.

S260: Perform surface polishing processing on the patterned SOI substrate.

In this embodiment, annealing processing is further performed on the already formed patterned SOI substrate 300, so that abutted surfaces of the two silicon substrates, that is, surfaces of the second oxide layer 122 of the first silicon substrate 110 and the second silicon substrate 210 are tightly bonded. Further, because the silicon layer 110a of the first silicon substrate 110 in the patterned SOI substrate 300 is peeled off, various surface polishing processing may be performed on the patterned SOI substrate 300 after the silicon layer 110a is peeled off, where a smooth surface structure facilitates performing various processing when a device is formed.

According to the SOI substrate manufacturing method provided in this embodiment, a patterned etch-stop layer is formed in an oxide layer of a first silicon substrate, a surface, having the patterned etch-stop layer, of the first silicon substrate is bonded with a silicon surface of a second silicon substrate, and a part of the first silicon substrate is peeled off to form a patterned SOI substrate, which resolves a problem in the prior art that when a heteroepitaxial layer is grown on a silicon layer of an SOI substrate, a great quantity of threading dislocations is caused due to lattice mismatch and thermal mismatch occurred between the silicon layer and the heteroepitaxial layer.

According to the patterned SOI substrate provided in this embodiment, a heteroepitaxial layer without threading dislocations can be formed on a silicon substrate, improving usage performance and reliability of a photoelectric device.

Embodiment 3

Figure 6:
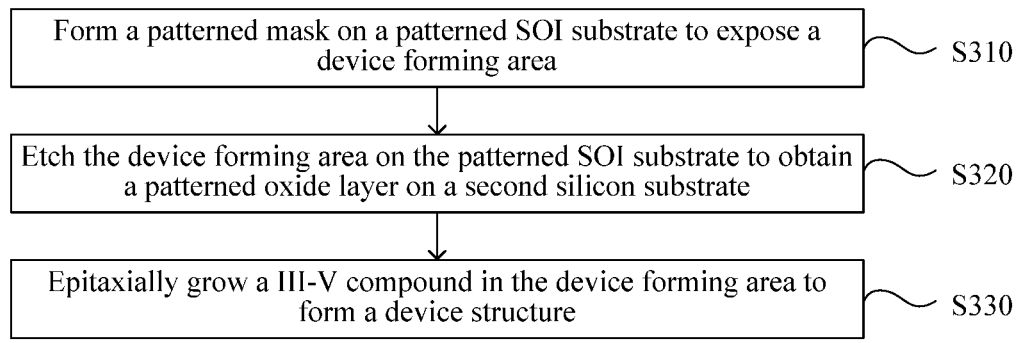
FIG. 6 is a flowchart of a method for growing a heteroepitaxial III-V structure using a patterned SOI substrate according to Embodiment 3 of the present disclosure.

FIG. 6 is a flowchart of a method for growing a heteroepitaxial III-V structure using a patterned SOI substrate according to Embodiment 3 of the present disclosure. FIG. 7A to FIG. 7E are schematic diagrams of a technological process according to the embodiment shown in FIG. 6. The method provided in this embodiment is applicable to a case in which a heteroepitaxial structure is formed on the patterned SOI substrate provided in the foregoing embodiment. As shown in FIG. 6, the method provided in this embodiment may include:

S310: Form a patterned mask on a patterned SOI substrate to expose a device forming area.

Figure 7A:
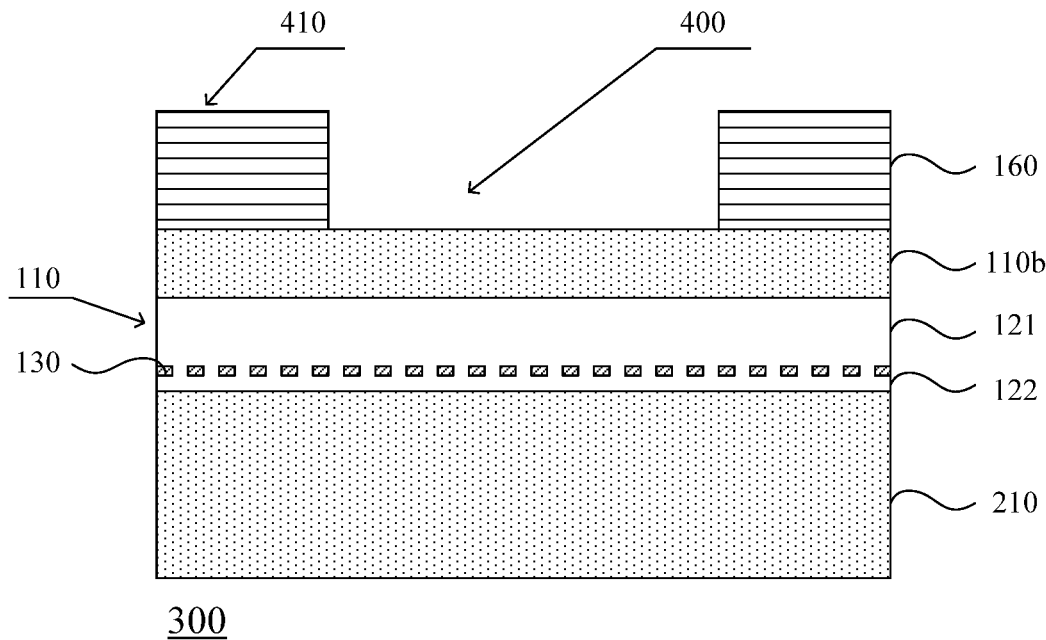
FIG. 7A to FIG. 7E are schematic diagrams of a substrate structure in the SOI substrate manufacturing method according to the embodiment shown in FIG. 6.

Referring to FIG. 7A, according to the method that is provided in this embodiment and based on the foregoing embodiment, a patterned SOI substrate 300 is heteroepitaxially grown, so as to obtain a structure that is applicable to manufacturing a photoelectric device. Normally, many independent devices are going to be fabricated on this wafer, they are separated from each other. Therefore, a device forming area 400 is first obtained in the patterned SOI substrate 300 according to a pattern of a to-be-manufactured device, where the to-be-produced photoelectric device is produced using the device forming area 400 as a substrate, and a part, in the patterned SOI substrate 300, outside the device forming area 400 is used to separate devices, that is, a device separation area 410. The patterned SOI substrate 300 is processed with the patterned mask using a photolithography technique, so that the device forming area 400 is formed in a window part of the patterned mask, that is, a part that is not covered by a photoresist 160.

S320: Etch the device forming area on the patterned SOI substrate to obtain a patterned oxide layer on a second silicon substrate.

Figure 7B:
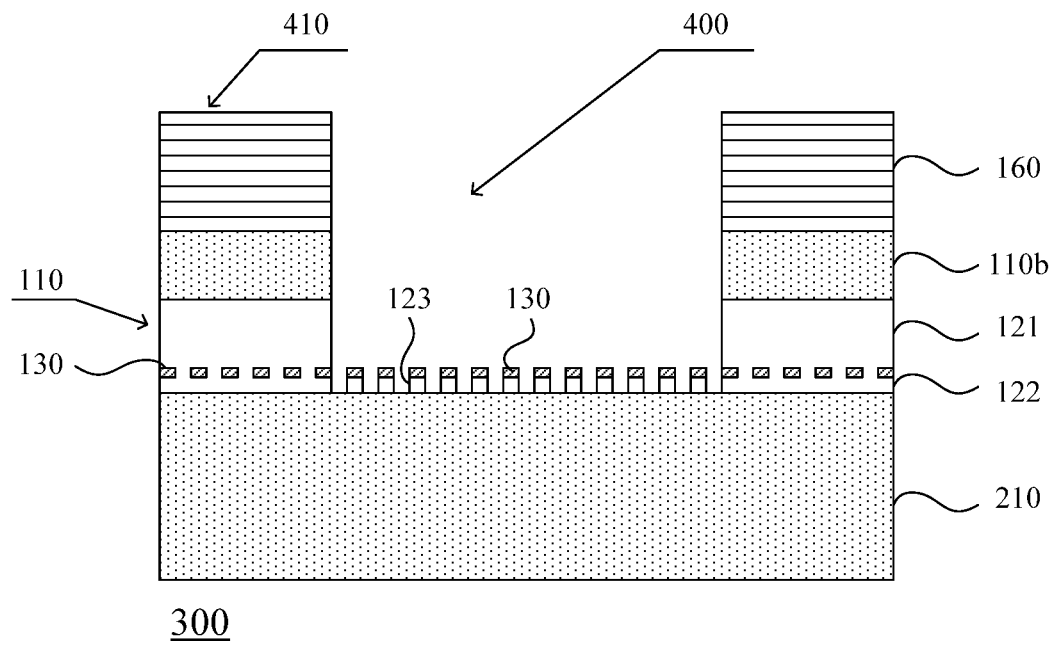
Figure 7C:
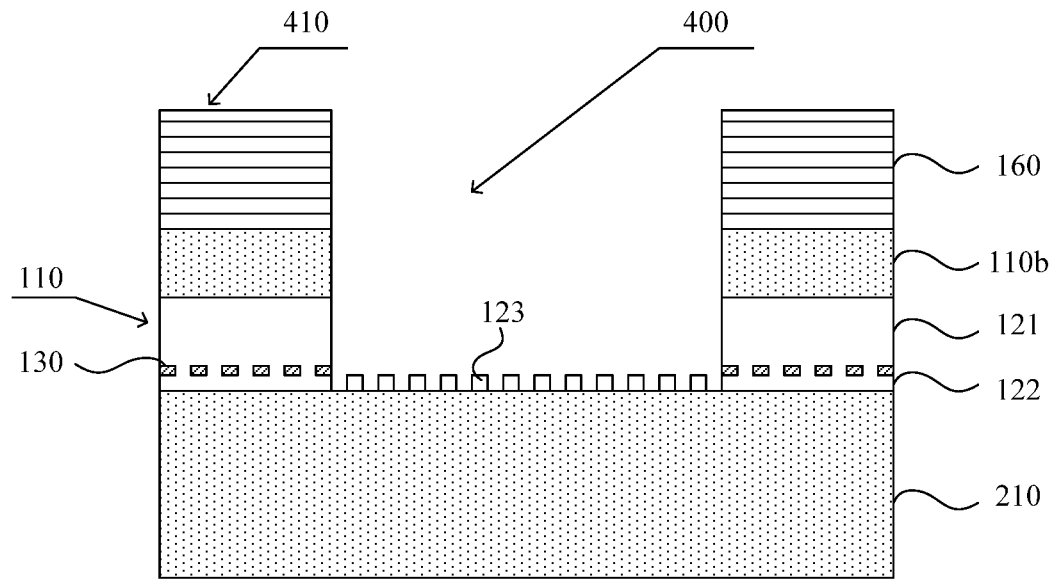

Referring to FIG. 7B, in this embodiment, the device forming area 400 of the patterned SOI substrate 300 is not covered by the photoresist 160, and therefore, when the patterned SOI substrate 300 is etched, the silicon layer 110b, the first oxide layer 121, and a part of the second oxide layer 122 of the first silicon substrate 110 in the device forming area 400 are etched first to obtain a patterned oxide layer 123 on the second silicon substrate 210 and the patterned etch-stop layer 130, where the patterned oxide layer 123 is under the patterned etch-stop layer 130. Referring to FIG. 7C, the patterned etch-stop layer 130 in the device forming area 400 in the patterned SOI substrate 300 is further removed to obtain the patterned oxide layer 123 on the second silicon substrate 210.

It should be noted that, materials of the etched silicon layer 110b, first oxide layer 121, and part of the second oxide layer 122 of the first silicon substrate 110 in the device forming area 400 are silicon oxide, and a material of the patterned etch-stop layer 130 may be a material having etching selectivity, and generally includes a material such as silicon nitride, aluminium oxide, titanium oxide, silicon rich silicon oxide, or hydrogen rich silicon nitride. In specific implementation, an etching gas having a high selective ratio to silicon oxide may be selected, thereby implementing that the patterned etch-stop layer 130 is barely etched while the silicon oxide is etched. The etching gas may generally include an addition of a fluorine-based gas having high carbon content, such as $C_2F_2$ or $CHF_3$, or hydrogen content in the etching gas may be increased. Therefore, the patterned oxide layer 123 on the second silicon substrate 210 and the patterned etch-stop layer 130 can be formed after silicon oxide is etched, where the patterned oxide layer 123 is the part of the second oxide layer 122, and is specifically a part, covered by the patterned etch stop layer 130, of the second oxide layer 122. Description is made using an example in which the material of the patterned etch-stop layer 130 is silicon nitride. Similarly, an etching gas having a high selective ratio to silicon nitride is selected, so as to implement that the patterned oxide layer 123 is barely etched while the patterned etch-stop layer 130 is etched. Therefore, the patterned oxide layer 123 having a small-size pattern is finally obtained in the device forming area 400 of the patterned SOI substrate 300, where the pattern has a size the same as the pattern size of the patterned etch-stop layer 130 in the foregoing embodiment, and is generally less than 20 nm. It should be further noted that, a lower aperture of a window of the patterned oxide layer 123 that is formed by means of etching is generally less than or equal to an upper aperture of the window, that is, the window has a vertical or sloping side wall.

S330: Epitaxially grow a III-V compound in the device forming area to form a device structure.

Figure 7D:
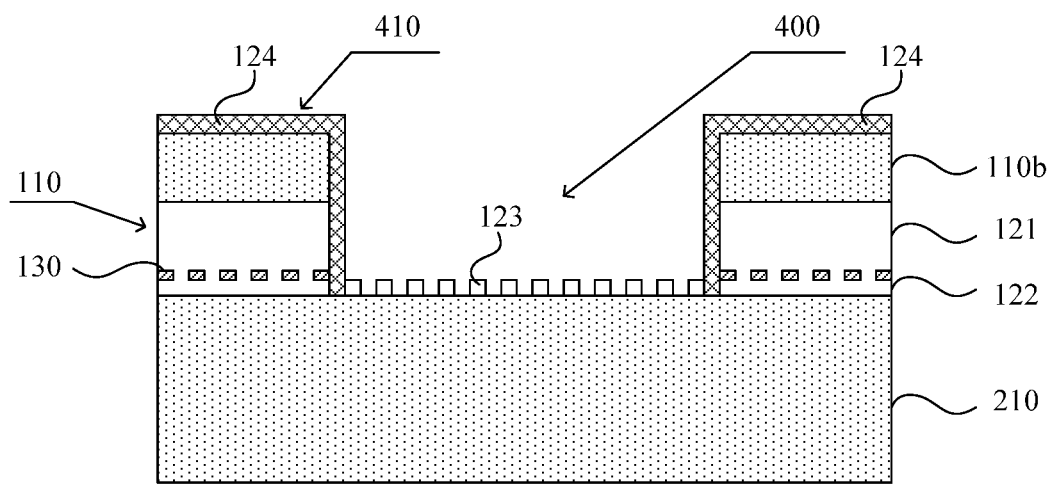
Figure 7E:
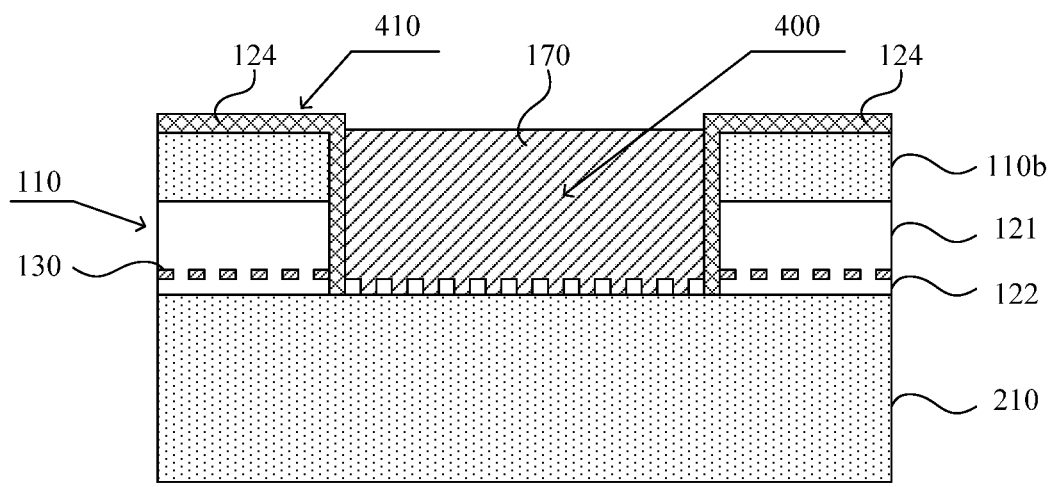

Referring to FIG. 7D, in this embodiment, there is the patterned oxide layer 123 having an extremely small pattern on the second silicon substrate 210 in the device forming area 400 of the patterned SOI substrate 300, and therefore, a heteroepitaxial layer may be grown in the device forming area 400. Description is made using an example in which a III-V compound is epitaxially grown in this embodiment. In specific implementation, a third oxide layer 124 may be grown on the second silicon substrate 210 on which the patterned oxide layer 123 has already been obtained. The third oxide layer 124 is grown outside the device forming area 400, and is used to provide a mask function for the device separation area 410 when the III-V compound is epitaxially grown, that is, the III-V compound is not grown in an area outside the device forming area 400. Referring to FIG. 7E, the III-V compound is epitaxially grown on the patterned oxide layer 123 on the second silicon substrate 210 on which the third oxide layer 124 is already grown, so as to form a device structure 170, and the epitaxially grown III-V compound is connected to the second silicon substrate 210 in the pattern of the patterned oxide layer 123 on the second silicon substrate 210. Specifically, because there is the patterned oxide layer 123 on the second silicon substrate

210, a III-V compound epitaxial layer without threading dislocations can be formed in the device forming area 400.

It should be noted that, the III-V compound in this embodiment may include, for example, AlP, GaP, InP, AlAs, GaAs, InAs, AlSb, GaSb, InSb, MN, GaN, InN, or ternary and quaternary compounds thereof. A manner of epitaxially growing the III-V compound in the device forming area 400 may include, for example, a molecular beam epitaxy (MBE) technique, a chemical vapor deposition (CVD) technique, an atomic layer deposition (ALD) technique, or a variation technique thereof. For example, a variation technique of CVD may include: metal organic chemical vapor deposition (MOCVD), plasma enhanced chemical vapor deposition (PECVD), low pressure chemical vapor deposition (LP-CVD), ultra high vacuum chemical vapor deposition (UHVCVD), and reduced pressure chemical vapor deposition (RPCVD).

According to the method provide in this embodiment, a patterned etch-stop layer is formed in an oxide layer of a first silicon substrate, a surface, having the patterned etch-stop layer, of the first silicon substrate is bonded with a surface of a second silicon substrate, and a part of the first silicon substrate is peeled off to form a patterned SOI substrate; further, an oxide layer having a small-size pattern on the second silicon substrate is formed in a device forming area on the patterned SOI substrate by means of an etch-stop function of the patterned etch-stop layer, and a heteroepitaxial layer without threading dislocations can be grown in the device forming area using this patterned oxide layer on the second silicon substrate, which resolves a problem in the prior art that when a heteroepitaxial layer is grown on a silicon layer of an SOI substrate, a great quantity of threading dislocations is caused due to lattice mismatch and thermal mismatch occurred between the silicon layer and the heteroepitaxial layer, and improves usage performance and reliability of a photoelectric device. Further, according to the method provided in this embodiment, the heteroepitaxial layer without threading dislocations can be grown by performing photolithography in the device forming area only once, improving compatibility with a CMOS technique.

Further, in this embodiment, annealing processing may be further performed on the patterned SOI substrate 300 in which the device structure 170 is already formed, so as to reduce a defect caused in an ELO process of the III-V compound in the device forming area 400.

In this embodiment, the heteroepitaxial layer without threading dislocations is formed in the device forming area 400 of the patterned SOI substrate 300, and therefore, a photoelectric device structure can be formed in the device forming area 400, that is, on the device structure 170, where the photoelectric device structure generally includes a multilayer structure.

Referring to FIG. 3B, FIG. 3B is also a schematic structural diagram of an SOI substrate according to an embodiment of the present disclosure. The SOI substrate may be manufactured using the SOI substrate manufacturing method provided in the embodiment shown in FIG. 1, and implementation processes and beneficial effects are the same, which are not described herein again.

Referring to FIG. 5G, FIG. 5G is a schematic structural diagram of another SOI substrate according to an embodiment of the present disclosure. The SOI substrate may be manufactured using the SOI substrate manufacturing method provided in the embodiment shown in FIG. 4, and implementation processes and beneficial effects are the same, which are not described herein again.

Referring to FIG. 7E, FIG. 7E is a schematic structural diagram of still another SOI substrate according to an embodiment of the present disclosure. The SOI substrate may be manufactured using the SOI substrate manufacturing method provided in the embodiment shown in FIG. 6, and implementation processes and beneficial effects are the same, which are not described herein again.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A silicon on insulator (SOI) substrate manufacturing method, comprising:
    forming a patterned etch-stop layer in an oxide layer of a first silicon substrate; wherein the patterned etch-stop layer has a consistent pattern throughout the entire patterned etch-stop layer;
    bonding a surface of the oxide layer of the first silicon substrate with a surface of a second silicon substrate;
    peeling off a part of the first silicon substrate to form a pattern-buried SOI substrate;
    forming a patterned mask on the pattern-buried SOI substrate to expose a device forming area in the pattern-buried SOI substrate;
    etching the device forming area on the pattern-buried SOI substrate through an etch-stop function of the patterned etch-stop layer to obtain a patterned oxide layer on the second silicon substrate, wherein the patterned oxide layer is under the patterned etch-stop layer; and
    removing the patterned etch-stop layer in the device forming area to make the entire patterned oxide layer expose in the device forming area to the device forming area, wherein the patterned etch-stop layer outside the device forming area remains present in the silicon substrate after the device is formed.

2. The method according to claim 1, wherein the forming a patterned etch-stop layer comprises:
    forming a first oxide layer on the first silicon substrate.

3. The method according to claim 2, further comprising:
    growing a second oxide layer on the patterned etch-stop layer.

4. The method according to claim 3, further comprising:
    performing flattening processing and chemical surface processing on the second oxide layer.

5. The method according to claim 3, wherein the method further comprises:
    epitaxially growing a III-V compound in the device forming area to form a device structure.

6. The method according to claim 5, wherein the growing a III-V compound comprise:
    growing a third oxide layer on the second silicon substrate on which the patterned oxide layer has already been obtained, wherein the third oxide layer is grown outside the device forming area; and
    growing the III-V compound on the patterned oxide layer of the second silicon substrate on which the third oxide layer is already grown, to form the device structure, wherein the grown III-V compound is connected to the second silicon substrate in a pattern of the patterned oxide layer of the second silicon substrate.

7. The method according to claim 5, wherein the III-V compound comprises aluminium phosphide (AlP), gallium phosphide (GaP), indium phosphide (InP), aluminium arsenide (AlAs), gallium arsenide (GaAs), indium arsenide (InAs), aluminium antimonide (AlSb), gallium antimonide (GaSb), indium antimonide (InSb), aluminium nitride (AlN), gallium nitride (GaN), indium nitride (InN), or ternary and quaternary compounds thereof.

8. The method according to claim 5, wherein the III-V compound in the device forming area is grown by means of a molecular beam epitaxy (MBE) technique, a chemical vapor deposition (CVD) technique, an atomic layer deposition (ALD) technique, or a variation technique thereof, to form the device structure.

9. The method according to claim 5, further comprising: performing annealing processing on the patterned-buried SOI substrate in which the device structure is already formed, to reduce a defect caused by epitaxial lateral overgrowth (ELO) of the III-V compound in the device forming area.

10. The method according to claim 2, further comprising: performing ion implantation on the first silicon substrate to form a defect layer in a silicon layer of the first silicon substrate, wherein a peeled-off part of the first silicon substrate comprises the defect layer in the first silicon substrate and a silicon layer on the defect layer.

11. The method according to the claim 2, further comprising:
performing low-temperature annealing processing to make abutted surfaces of the first silicon substrate and the second silicon substrate tightly bonded; and
performing surface polishing processing on the pattern-buried SOI substrate.

12. The method according to claim 1, wherein the patterned etch-stop layer comprises a material having etching selectivity to the oxide layer of the first silicon substrate.

13. The method according to claim 1, wherein the patterned etch-stop layer comprise a plurality of same patterns, and each patterns has a pattern size that is less than 20 nm, and a thickness of the patterned etch-stop layer is less than 50 nm.

14. The method according to claim 1, wherein the method further comprises:
forming a photoelectric device structure in the device structure, wherein the photoelectric device structure comprises a multi-layer structure.

15. An apparatus, comprising:
a first silicon substrate;
an oxide layer of the first silicon substrate formed on one surface of the first silicon substrate;
a patterned etch-stop layer formed in the oxide layer of the first silicon substrate; wherein the patterned etch-stop layer has a consistent pattern throughout the entire patterned etch-stop layer;
a second silicon substrate, formed on the oxide layer of the first silicon substrate;
a SOI substrate, formed by peeling off a part of the first silicon substrate after bonding a surface of the oxide layer of the first silicon substrate with a surface of a second silicon substrate;
a device forming area on the SOI substrate, formed by a first patterned mask on the SOI substrate to expose an area;
a patterned oxide layer, formed by etching the device forming area on the SOI substrate through an etch-stop function of the patterned etch-stop layer, wherein the entire patterned oxide layer exposes to the device forming area, and wherein the patterned etch-stop layer outside the device forming area remains present in the silicon substrate after the device is formed;
a device structure, formed by epitaxially growing a III-V compound in the device forming area.

16. The apparatus according to claim 15, wherein oxide layer of the first silicon substrate comprises:
a first oxide layer, formed on the first silicon substrate;
the patterned etch-stop layer, formed on the first oxide layer of the first silicon substrate, and wherein the patterned etch-stop layer is obtained by etching an etch-stop layer according to a patterned mask on the etch-stop layer; and
a second oxide layer, grown on the patterned etch-stop layer.

17. The apparatus according to claim 15, wherein the patterned etch-stop layer comprises a material having etching selectivity to the oxide layer of the first silicon substrate.

18. The apparatus according to claim 15, wherein the patterned etch-stop layer comprise a plurality of same patterns, and each patterns has a pattern size that is less than 20 nm, and a thickness of the patterned etch-stop layer is less than 50 nm.

* * * * *